(12) United States Patent
Okubo et al.

(10) Patent No.: US 6,245,673 B1
(45) Date of Patent: Jun. 12, 2001

(54) METHOD OF FORMING TUNGSTEN SILICIDE FILM

(75) Inventors: Kazuya Okubo, Nakakoma-gun; Tsuyoshi Takahashi, Nirasaki; Kimiya Aoki, Musashino; Kimihiro Matsuse, Inagi, all of (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/385,848

(22) Filed: Aug. 30, 1999

(30) Foreign Application Priority Data

Sep. 1, 1998 (JP) .................................................. 10-262307
Apr. 13, 1999 (JP) .................................................. 11-105946

(51) Int. Cl.⁷ ................... H01L 21/3205; H01L 21/4763
(52) U.S. Cl. .......................... 438/649; 438/592; 438/655; 438/301
(58) Field of Search ..................................... 438/301, 586, 438/592, 648–683; 148/DIG. 147

(56) References Cited

U.S. PATENT DOCUMENTS 5,837,600 * 11/1998 Lim et al. ............................. 438/592
5,837,601 * 11/1998 Matsumoto .......................... 438/592
5,837,605   11/1998 Park et al. .

FOREIGN PATENT DOCUMENTS

785574 * 7/1997 (EP) ...................................... 21/768
860863 * 8/1998 (EP) ........................................ 21/28

* cited by examiner

*Primary Examiner*—Matthew Smith
*Assistant Examiner*—Igwe U. Amya
(74) *Attorney, Agent, or Firm*—Oblon, Spivak, McClelland, Maier & Neustadt, P.C.

(57) ABSTRACT

A first tungsten silicide layer relatively rich in silicon is formed on an object by using a process gas having a phosphorus atom-containing gas added thereto, and a second tungsten silicide layer relatively rich in tungsten is formed on the first tungsten silicide layer, so that a tungsten silicide film is formed. The addition amount of the phosphorus atom-containing gas to the process gas is 0.02 to 0.2% by volume "in terms of a phosphine gas".

13 Claims, 1 Drawing Sheet

METHOD OF FORMING TUNGSTEN SILICIDE FILM

BACKGROUND OF THE INVENTION

The present invention relates to a method of forming a tungsten silicide film used mainly in the manufacture of a semiconductor device, particularly, the tungsten silicide film used for forming a gate electrode/wiring in combination with, for example, a polycrystalline silicon layer and a method of forming the same.

A so-called "polyside structure", in which, for example, a polycrystalline silicon layer and a tungsten silicide layer are superposed one upon the other, is used for forming a gate electrode and a wiring in a semiconductor device such as LSI in order to lower the resistance of the gate electrode and the wiring. In this case, the tungsten silicide layer constituting the upper layer of the polyside structure is formed in general by a CVD method using $WF_6/SiCl_2H_2/Ar$ as a process gas. In the conventional film forming method, the required properties of the tungsten silicide layer are obtained by controlling the film forming temperature, the pressure of the process gas, the gas flow rate, the flow rate ratio of the gases, etc. Also, it is known to the art that, in order to control the resistivity of the tungsten silicide layer and to increase the resistance to migration, it is necessary to control the crystal grain diameter and the crystal orientation of the tungsten silicide layer.

In the conventional method of forming a tungsten silicide layer, however, it was impossible to control as desired the crystal grain diameter and the crystal orientation of the tungsten silicide layer. For example, the tungsten silicide film formed by the conventional method is large in nonuniformity of the crystal grain diameter. Also, concerning the crystal orientation, (002) faces and (101) faces are present in substantially the same rate. It follows that it is difficult to control the crystal grain diameter and the crystal orientation, leading to the problem that the crystals after the heat treatment are oriented at random.

BRIEF SUMMARY OF THE INVENTION

An object of the present invention is to provide a method of manufacturing a tungsten silicide film that makes it possible to align the crystal orientations of tungsten silicide, and to control the nonuniformity in the size of the crystal grains, thereby diminishing the resistivity, improving the resistance to migration and stabilizing the film properties.

A method of forming a tungsten silicide film according to a first aspect of the present invention comprises a first step of forming a first tungsten silicide layer relatively rich in silicon on a substrate using a process gas having a phosphorus atom-containing gas added thereto and a second step of forming a second tungsten silicide layer relatively rich in tungsten on the first tungsten silicide layer.

In this disclosure, a phosphorus-containing gas refers to a gas whose molecule includes one or more phosphorus atom. For example, it is preferable to use phosphine ($PH_3$). The process gas used in the present invention is a mixed gas composition consisting of a plurality of kinds of gases required for forming tungsten silicide. For example, it is preferable to use as the process gas a mixed gas consisting of tungsten hexafluoride ($WF_6$), dichlorosilane ($SiCl_2H_2$) and argon (Ar). The mixing ratio of the mixed gas ($WF_6/SiCl_2H_2/Ar$) can be set appropriately. In working the method of the present invention for forming a tungsten silicide film, it is necessary to use a gas composition prepared by adding a phosphorus atom-containing gas to the process gas in order to form at least the first tungsten silicide layer. By using a process gas having a phosphorus atom-containing gas added thereto, it is possible to control appropriately the crystal grain diameter and the crystal orientation of the tungsten silicide film so as to obtain a tungsten silicide film of stable film properties having a low resistivity and excellent in resistance to migration. It is preferable to add a phosphorus atom-containing gas in an amount of about 0.02 to 0.2% by volume based on the process gas amount. If the amount of the phosphorus atom-containing gas is smaller than 0.02% by volume, the effect produced by the addition of the phosphorus atom-containing gas cannot be recognized. If the addition amount exceeds 0.2% by volume, however, the film properties are deteriorated. For example, the adhesion of the tungsten silicide film to the underlying film is lowered.

In the film forming method of the present invention, it is preferable to use a process gas having a phosphorus atom-containing gas added thereto in the step of forming at least the first tungsten silicide layer. The phosphorus atom performs the function of controlling the crystal grain diameter and the crystal orientation within the tungsten silicide film. The phosphorus atom can be introduced into the tungsten silicide film during or after the film forming step. The phosphorus atom can be introduced into the tungsten silicide film by various methods. For example, the process gas having a phosphorus atom-containing gas added thereto can be heated to permit the phosphorus atom to be introduced into the tungsten silicide film simultaneously with formation of the tungsten silicide film. It is also possible to introduce the phosphorus atom into the tungsten silicide film by means of ion implantation using a phosphorus atom-containing gas after formation of the tungsten silicide film by means of CVD. Further, it is possible to introduce the phosphorus atom into the tungsten silicide film by exposing the tungsten silicide film to a plasma of a phosphorus atom-containing gas.

As described above, a process gas having a phosphorus atom-containing gas added thereto is used in the first step. The process gas serves to form a growing nucleus of tungsten silicide so as to control the crystal grain diameter and the crystal orientation. The tungsten silicide layer relatively rich in silicon referred to previously denotes a layer of tungsten silicide ($W_xSi_y$) in which a ratio x/y of the number of tungsten atoms to the number of silicon atoms is lower than 2/5, i.e., a tungsten silicide layer containing a high ratio of silicon atoms.

In the second step, a tungsten silicide film can be formed on the basis of the growing nucleus formed in the first step. In the second step, a tungsten silicide layer relatively rich in tungsten, in which the crystal grain diameter and the crystal orientation are aligned, can be formed by using the process gas alone without using a phosphorus atom-containing gas. The tungsten silicide layer relatively rich in tungsten referred to above denotes a layer of tungsten silicide ($W_xSi_y$) in which a ratio x/y of the number of tungsten atoms to the number of silicon atoms is higher than 2/5, i.e., a tungsten silicide layer containing a high ratio of tungsten atoms. Since the second step should desirably be carried out immediately after the first step, the phosphorus atom contained in the process gas used in the first step remains in the second step even if a phosphorus atom-containing gas is not added to the process gas used in the second step. Therefore, it is possible for the remaining phosphorus atoms in the first step to be mixed in the process gas used in the second step, which does not contain a phosphorus atom, resulting in formation of a tungsten silicide film containing traces of phosphorus atoms. It should also be noted that, even if a process gas that does not contain a phosphorus atom is used in the second step, it is possible for phosphorus atoms to be diffused from the first tungsten silicide layer (lower layer) into the second tungsten silicide layer (upper layer), resulting in formation of a tungsten silicide film containing phosphorus atoms. The second tungsten silicide layer of the present invention substantially free from phosphorus atoms should be interpreted to include a tungsten silicide layer that has been unavoidably allowed to contain phosphorus atoms during the film forming treatment.

A process gas having a phosphorus atom-containing gas added thereto can also be used in the second step of forming the second tungsten silicide layer as well as in the first step of forming the first tungsten silicide layer. In this case, the addition rate of the phosphorus atom-containing gas in the first step should be set higher than that in the second step. In other words, the first tungsten silicide layer (lower layer) should be formed by using a process gas having a predetermined amount of phosphorus atom-containing gas added thereto, and the second tungsten silicide layer (upper layer) should be formed by using a process gas having a phosphorus atom-containing gas added thereto in an amount smaller than that in forming the first tungsten silicide layer. As a result, it is possible to form a tungsten silicide film consisting of the lower layer having a predetermined phosphorus atom concentration and the upper layer having a phosphorus atom concentration lower than that of the lower layer. Even if the phosphorus atom concentration in the second tungsten silicide layer (upper layer) is made lower than that in the first tungsten silicide layer (lower layer), the phosphorus atoms are diffused from the lower layer into the upper layer during the heat treatment performed after the film formation, with the result that the phosphorus concentration is made substantially uniform over the entire tungsten silicide film consisting of the lower and upper layers.

It is preferable for the first tungsten silicide layer (lower layer) as formed to contain $1 \times 10^{21}$ $cm^{-3}$ or more of phosphorus atoms. If the phosphorus concentration exceeds $5 \times 10^{21}$ $cm^{-3}$, however, the tungsten silicide layer is made amorphous. It follows that the phosphorus concentration of the first tungsten silicide layer should desirably fall within a range of between $1 \times 10^{21}$ $cm^{-3}$ and $5 \times 10^{21}$ $cm^{-3}$. The phosphorus concentration of the second tungsten silicide layer (upper layer) should desirably be lower than that of the first tungsten silicide layer, i.e., not higher than $1 \times 10^{21}$ $cm^{-3}$. If the phosphorus concentration is lower than $5 \times 10^{19}$ $cm^{-3}$, however, phosphorus fails to produce a sufficient effect. It follows that the phosphorus concentration of the second tungsten silicide layer (upper layer) should desirably fall within a range of between $5 \times 10^{19}$ $cm^{-3}$ and $1 \times 10^{21}$ $cm^{-3}$. Further, the phosphorus concentration of the upper layer as formed, i.e., before heat treatment, should desirably be not higher than $1/10$ the phosphorus concentration of the lower layer. If the lower and upper layers are substantially equal to each other in the phosphorus concentration, the phosphorus atoms in the first tungsten silicide layer are not diffused into the second tungsten silicide layer during the heat treatment, with the result that a high phosphorus concentration is maintained in the first tungsten silicide layer (lower layer). It follows that the adhesion of the lower layer to the underlying polycrystalline silicon layer is deteriorated so as to cause the tungsten silicide film to be peeled off the polycrystalline silicon layer easily. The crystal orientation and the crystal grain diameter of the tungsten silicide film can be controlled as desired by setting the phosphorus concentration of the lower layer at $1 \times 10^{21}$ $cm^{-3}$ or more in the film forming step. A tungsten silicide layer having a phosphorus concen- tration of $1 \times 10^{21}$ $cm^{-3}$ or more can be formed by using a process gas having a phosphorus atom-containing gas added thereto in an amount of 0.02 to 0.2% by volume "in terms of phosphine gas". The process gas consists of a carrier gas (and a backside gas as desired), which is an inert gas such as Ar that is not directly involved in the film formation, and a reactive gas that is directly involved in the film formation. In the Examples described herein later, a mixed gas of $WF_6$, $SiCl_2H_2$, and $PH_3$, as required, is used as the reactive gas. It is preferable to add about 0.2 to 0.4% by volume of a phosphorus atom-containing gas to the reactive gas. The phosphorus atom-containing gas should desirably be added to the reactive gas in an amount of about 0.2 to 0.4% by volume.

In the present invention, the addition amount of the phosphorus atom-containing gas may be defined "in terms of phosphine gas". It should be noted that a phosphine molecule ($PH_3$) has a single phosphorus atom. Therefore, in the case of using phosphine as the phosphorus atom-containing gas, the process gas should include phosphine of an amount of 0.02 to 0.2% by volume as defined previously. In the case of using a gaseous compound having N-number of phosphorus atoms in a molecule, the addition amount of the gas should be $(0.02$ to $0.2) \times 1/N\%$ by volume on the assumption that the utilization rate of all the phosphorus atoms 100%. In the case of using $P_2O_n$, which has two phosphorus atoms in a molecule, as a phosphorus atom-containing gas, the addition amount in the process gas should desirably be about $(0.02$ to $0.2) \times 1/2\%$ by volume, while the addition amount in the reactive gas about $(0.2$ to $0.4) \times 1/2\%$ by volume.

If the phosphorus concentration is set high in each of the first and second tungsten silicide layers (upper and lower layers) in the film forming step, the tungsten silicide film is made amorphous. This is unpreferable because the film is swollen in the subsequent heat treating step. In this point, the phosphorus concentration in the entire tungsten silicide film including the lower and upper layers should desirably be set finally at $1 \times 10^{21}$ $cm^{-3}$ or less after the heat treatment.

The tungsten silicide film formed by the method of the present invention should desirably have a crystal grain diameter of 0.06 to 0.1 $\mu$m and a standard deviation of 0.01 $\mu$m or less and, more desirably, an average crystal grain diameter of 0.07 to 0.09 $\mu$m and a standard deviation of 0.008 $\mu$m or less. If the average diameter of the crystals is less than 0.06 $\mu$m, the resistance to migration tends to be poor. On the other hand, if the average diameter of the crystals exceeds 0.1 $\mu$m, it is difficult to control the crystal grains. Also, if the standard deviation exceeds 0.01 $\mu$m, the produced effect could be of poor reproductivity.

The crystals of the tungsten silicide film formed by the method of the present invention are mainly cubic system. In order to lower the resistivity of the tungsten silicide film formed, the rate of the crystals orienting substantially on the (002) face should be at least about 10 times as high as the rate of the crystals orienting on the (101) face. The resistivity of the tungsten silicide film is lowered with increase in the rate of the crystals orienting on the (002) face. Also, if the rate of the crystals orienting on the (002) face is less than 10 times as high as the rate of the crystal orienting on the (101) face, the resistivity of the tungsten silicide film fails to be lowered sufficiently.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

One embodiment of the present invention will now be described with reference to FIGS. 1 and 2.

Figure 1:
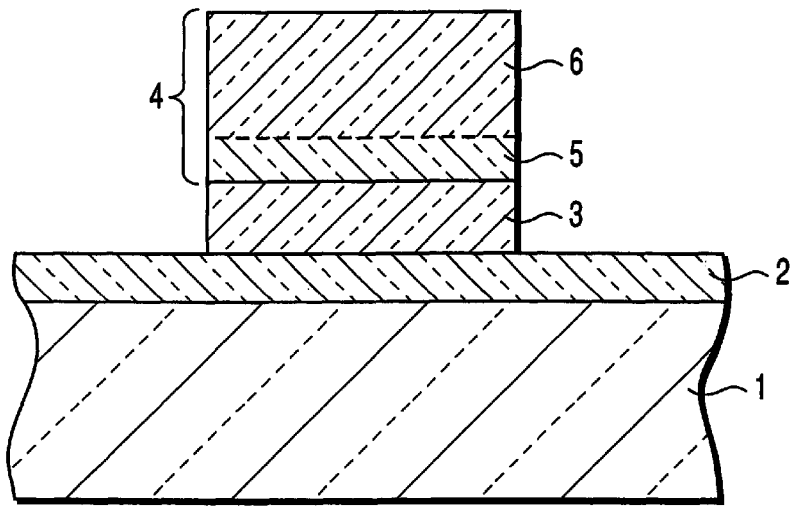
FIG. 1 is a cross sectional view showing a part of a semiconductor device according to one embodiment of the present invention.

Specifically, FIG. 1 is a cross sectional view showing in a magnified fashion a gate portion of a semiconductor device using a tungsten silicide film according to one embodiment of the present invention. As shown in the drawing, a silicon oxide film 2 having a thickness of about 100 Å, which constitutes a gate insulating film, is formed on, for example, a silicon wafer 1. A polycrystalline silicon film 3 having a thickness of 100 Å is formed on the silicon oxide film 2. Further, a tungsten silicide film 4 is formed on the polycrystalline silicon film 3. The tungsten silicide film 4 is of a double-layer structure consisting of a first layer 5, i.e., lower layer, and a second layer 6, i.e., upper layer. The lower layer 5, which provides a growing nucleus in forming the upper layer 6, consists of tungsten silicide relatively rich in silicon. The upper layer 6, which occupies substantially the entire thickness of the tungsten silicide film, consists of a layer relatively rich in tungsten.

The lower layer 5 has a thickness of, for example, about 150 Å, and the upper layer 6 has a thickness of, for example, about 850 Å. Thus, the entire thickness of the tungsten silicide film 4 is about 1000 Å. The tungsten silicide film 4 can be formed by the conventional CVD method. However, this embodiment is featured in that a phosphorus atom-containing gas, e.g., phosphine gas, is added to the process gas ($WF_6/SiCl_2H_2/Ar$) for forming the tungsten silicide film. This embodiment differs in this point from the conventional process.

EXAMPLES

The film forming method of this embodiment will now be described in detail with reference to Examples 1 to 3. In these Examples, a semiconductor wafer having a diameter of, for example, 8 inches was used as an object to be processed, and the inner volume of the process chamber included in the film forming apparatus used was, for example, about 18 liters. Also, the tungsten silicide film 4 of this embodiment was formed under the conditions given below on the polycrystalline silicon film 3 that was formed in advance.

Example 1:

A process gas having a phosphine gas added thereto, i.e., $WF_6/SiCl_2H_2/Ar$ (carrier gas)/$PH_3$/Ar (backside gas)=1 sccm/300 sccm/100 sccm/60 sccm/100 sccm), was supplied into the process chamber in the first step of the film forming process. The $PH_3$ flow rate denotes that of $PH_3$ diluted to 1%, which is also the case with the other Examples described herein. The film forming treatment was continued for about 50 seconds under the conditions that the susceptor temperature within the process chamber was set at about 625° C., and the gas pressure within the process chamber was set at about 4.5 Torr to form the lower layer 5 in a thickness of about 150 Å on the polycrystalline silicon layer 3 formed on the semiconductor wafer. In this case, the phosphine gas concentration relative to the process gas was about 0.11% by volume.

Then, the upper layer 6 was formed on the lower layer 5 in the second step by a continuous film forming process. In the second step, a process gas having a phosphine gas added thereto, i.e., $WF_6/SiCl_2H_2/Ar$ (carrier gas)/$PH_3$/Ar (backside gas)=5 sccm/50 sccm/350 sccm/10 sccm/100 sccm), was supplied into the process chamber. The film forming treatment was continued for about 40 seconds under the conditions that the susceptor temperature was set at about 625° C., and the pressure within the process chamber was set at about 4.5 Torr to form the upper layer 6 in a thickness of about 850 Å on the lower layer 5. In this Example, the phosphine gas addition amount in the second step for forming the upper layer 6 was smaller than that in the first step for forming the lower layer 5. In this case, the phosphine gas concentration was about 0.02% by volume or about 0.181% by volume relative to the reactive gas.

The Ar gas used as a backside gas in this Example was introduced into the process chamber from a lower portion of the chamber to prevent a film from being formed on the lower surface of the wafer. The other gases were introduced into the process chamber from an upper portion of the chamber.

Example 2:

In this Example, a process gas having a phosphine gas added thereto, i.e., $WF_6/SiCl_2H_2/Ar$ (carrier gas)/$PH_3$/Ar (backside gas)=1 sccm/300 sccm/100 sccm/ 60 sccm/100 sccm), was supplied into the process chamber in only the first step of forming the lower layer 5. In the step of forming the upper layer 6, a process gas having a phosphine gas not added thereto, i.e., $WF_6/SiCl_2H_2/Ar$ (carrier gas)/Ar (backside gas)=5 sccm/50 sccm/350 sccm/100 sccm), was supplied into the process chamber. The film forming treatment was continued for about 50 seconds for forming the lower layer 5 and for about 40 seconds for forming the upper layer 6. The lower layer 5 was about 150 Å thick and the upper layer 6 was about 850 Å thick. The structure as shown in FIG. 1 can be obtained by etching the resultant laminate structure in a predetermined pattern. The susceptor temperature in the film forming step was 625° C., and the pressure within the process chamber was 4.5 Torr. Further, the phosphine gas concentration was about 0.11% by volume in the step of forming the lower layer.

Example 3:

A process gas having a phosphine gas added thereto, i.e., $WF_6/SiCl_2H_2/Ar/PH_3$/Ar (backside gas)=1 sccm/300 sccm/ 20 sccm/120 sccm/100 sccm), was supplied into the process chamber in the first step of forming the lower layer 5. In the step of forming the upper layer 6, a process gas without a phosphine gas, i.e., $WF_6/SiCl_2H_2/Ar$/Ar (backside gas)=7 sccm/85 sccm/350 sccm/100 sccm), was supplied into the process chamber. The film forming treatment was continued for about 40 minutes for forming each of the lower layer 5 and the upper layer 6. In the film forming step, the susceptor temperature was set at 605° C. and the inner pressure of the process chamber was set at about 4.5 Torr. Under these conditions, formed were the lower layer 5 having a thickness of about 150 Å and the upper layer 6 having a thickness of about 850 Å. The phosphine gas concentration in the step of forming the lower layer 5 was about 0.2% by volume, or about 0.397% by volume based on the reactive gas.

In each of the Examples described above, a process gas containing a relatively small amount of $WF_6$ gas and a relatively large amount of $SiCl_2H_2$ gas was used in the step of forming the lower layer 5 so as to form the first tungsten silicide layer relatively rich in silicon. On the other hand, a process gas containing a relatively large amount of $WF_6$ gas and a relatively small amount of $SiCl_2H_2$ gas was used in the step of forming the upper layer 6 so as to form the second tungsten silicide layer relatively rich in tungsten.

For confirming the effect produced by the Examples described above, samples were prepared by the conventional film forming method under the conditions given below. Specifically, a process gas i.e., $WF_6/SiCl_2H_2/Ar/Ar$ (backside gas)=1 sccm/300 sccm/100 sccm/100 sccm), was supplied into the process chamber. The film forming treatment was continued for about 30 seconds under the conditions that the susceptor temperature was set at about 550 to 590° C., and the inner pressure of the process chamber was set at about 4.5 Torr to form the lower layer 5 in a thickness of about 150 Å. Then, a process gas differing in composition from the process gas noted above, i.e., a process gas of $WF_6/SiCl_2H_2/Ar/Ar$ (backside gas)=5 sccm/50 to 150 sccm/350 sccm/100 sccm), was supplied into the process chamber. The film forming treatment was continued for about 40 to 60 seconds under the conditions that the susceptor temperature was set at about 550 to 590° C., and the inner pressure of the process chamber was set at about 4.5 Torr to form the upper layer 6 in a thickness of about 850 Å. The conditions for forming the silicon oxide film 2 and the polycrystalline silicon layer 3 on the silicon wafer 1 were equal to those in Examples 1 to 3.

Figure 2:
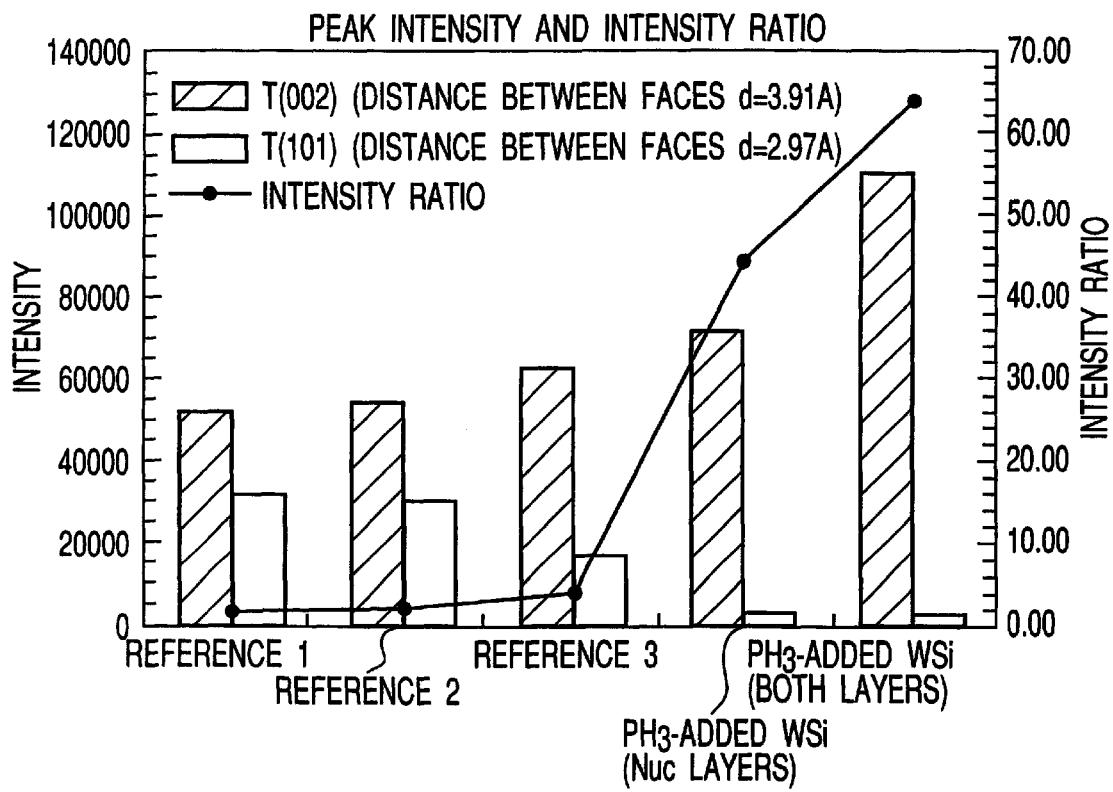
FIG. 2 is a graph showing in comparison the x-ray diffraction peak intensities of the crystal faces of the tungsten silicide films formed under various conditions.

X-ray diffraction intensity in the crystal face of the tungsten silicide film 4 of each of the samples obtained in Examples 1 to 3 and the conventional method was measured, with the results as shown in the graph of FIG. 2. Samples are plotted on the abscissa of the graph. The intensities of the samples are plotted on the ordinate on the left side of the graph. Further, the intensity ratios {T(002) orientation/T (101) orientation} are plotted on the ordinate on the right side of the graph. The letter "T" given above is an abbreviation of "tetragonal", which represents a cubic system. The intensity ratio {T(002) orientation/T(101) orientation} was found to be about 63 in Example 1 in which a phosphine gas was added in forming each of the lower layer 5 and the upper layer of the tungsten silicide film 4. On the other hand, the intensity ratio {T(002) orientation/T(101) orientation} was found to be about 43 in Example 2 and about 45 in Example 3 in which a phosphine gas was added in forming only the lower layer 5 of the tungsten silicide film 4. The experimental data clearly support that crystal grains oriented in the T(002) orientation are present predominantly in the tungsten silicide film 4 formed by the method of the present invention. In three samples prepared by the conventional method, which are denoted by "reference" in FIG. 2, however, the intensity in the T(002) orientation was found to be only about 2 to 4 times as high as the intensity in the T(101) orientation. The tungsten silicide film obtained in each of Examples 1 to 3 was annealed at temperatures higher than the film forming temperature, e.g., about 850° C., for a predetermined time, e.g., about 60 minutes. The intensity ratio {T(002) orientation/T(101)} of the tungsten silicide film after the annealing treatment was found to be about 10 or more, supporting the effect of the present invention. However, it is preferable for the intensity ratio to be 20 or more. The crystal states of the tungsten silicide films 4 formed by the Examples of the present invention and by the conventional method were compared on the basis of the cross sectional TEM (transmission electron microscope) photograph. The crystal orientation was found to be non-uniform in the film formed by the conventional method. Also, a large nonuniformity was found in the crystal grain diameters.

On the other hand, the orientations of the crystals were found to be substantially aligned and the nonuniformity in the crystal grain diameters was found to be small in the tungsten silicide film 4 formed in the Examples of the present invention. The crystal grain diameter of the tungsten silicide film 4 formed in the Examples of the present invention and annealed at 850° C. for 60 minutes was found to be about 0.08 μm on the average and the standard deviation was found to be about 0.007 μm, when roughly calculated on the basis of the TEM photograph.

The wiring formed by the tungsten silicide film 4 formed in the Examples of the present invention has a so-called "bamboo structure" and is expected to exhibit a high resistance to migration. The lower layer (first tungsten silicide layer) 5 formed in each of Examples 1 and 2 was compared with the upper layer (second tungsten silicide layer) 6 formed in each of Examples 1 and 2 in respect of the phosphorus concentration, with the results as shown in Table 1. As apparent from the experimental data, the lower layers 5 for Examples 1 and 2 contained $2 \times 10^{21}$ $cm^{-3}$ which is higher than $1 \times 10^{21}$ $cm^{-3}$ of phosphorus atoms, supporting that the phosphorus concentration in the lower layer 5 immediately after the film formation should desirably be at least $1 \times 10^{21}$ $cm^{-3}$ in order to control the crystal orientation and the crystal grain diameter. It has also been found that the upper layer 6 formed in Example 2 by using a process gas that did not contain phosphine contained $5 \times 10^{19}$ $cm^{-3}$ of phosphorus atoms, i.e., a phosphorus concentration lower than $1 \times 10^{21}$ $cm^{-3}$. It is considered reasonable to understand that the residual phosphine gas after formation of the lower layer was mixed into the process gas in the step of forming the upper layer 6, or the phosphorus atoms are considered to have diffused from the lower layer 5 into the upper layer 6 in the step of forming the upper layer 6. In any of Examples 1 and 2, the phosphorus atom concentration in the tungsten silicide film 4 after the heat treatment was found to be not higher than $1 \times 10^{21}$ $cm^{-3}$. The low phosphorus atom concentration is considered to have been caused mainly by the diffusion of the phosphorus atoms from the lower layer 5 into the upper layer 6.

TABLE 1

| | Phosphorus concentration in tungsten silicide film ($cm^{-3}$) | | |
|---|---|---|---|
| | Immediately after film formation | | After heat treatment |
| | Lower layer | Upper layer | (850° C., 30 minutes) |
| Example 1 | $2 \times 10^{21}$ | $1.5 \times 10^{20}$ | $4 \times 10^{20}$ |
| Example 2 | $2 \times 10^{21}$ | $5 \times 10^{19}$ | $2 \times 10^{20}$ |

In working the method of the present invention, the flow rate of $WF_6$ in the step of forming the upper layer 6 is made higher than that in the step of forming the lower layer 5. Also, the flow rate of $SiCl_2H_2$ in the step of forming the upper layer 6 is made lower than that in the step of forming the lower layer 5. However, it is also possible to make the flow rate of $SiCl_2H_2$ alone higher in forming the lower layer and to make the flow rate of $WF_6$ alone higher in forming the upper layer. In the Examples described above, the flow rate of the process gas for forming the lower layer 5 and the upper layer 6 was maintained substantially constant by changing the flow rate of Ar used as a carrier gas so as to minimize the pressure fluctuation within the process chamber. However, it is not absolutely necessary to maintain the flow rate of the process gas constant in forming the lower layer 5 and the upper layer 6. Also, in the Examples described above, the tungsten silicide film was formed on the object, i.e., polycrystalline silicon film in the Examples, on the semiconductor wafer. However, the object on which the tungsten silicide film is to be formed is not limited to a substrate. Further, the technical idea of the present invention is applied to the manufacture of a semiconductor device in the Examples described above. However, the tungsten silicide film of the present invention can be employed in the electrode/wiring structure in, for example, an LCD.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of forming a tungsten silicide film, comprising the steps of:

forming a first tungsten silicide layer containing phosphorus atoms; and forming a second tungsten silicide layer on said first tungsten silicide layer, said second tungsten silicide layer being substantially free from phosphorus atoms or the phosphorus concentration in the second tungsten silicide layer being lower than that in said first tungsten silicide layer.

2. A method of forming a tungsten silicide film according to claim 1, wherein said step of forming said first tungsten silicide layer comprises a process of forming a first tungsten silicide layer by using a process gas having a phosphorus atom-containing gas added thereto, and said step of forming said second tungsten silicide layer comprises a process of forming a second tungsten silicide layer by using a process gas not having a phosphorus atom-containing gas added thereto.

3. A method of forming a tungsten silicide film according to claim 2, wherein the addition amount of said phosphorus atom-containing gas to the process gas is 0.02 to 0.2% by volume "in terms of a phosphine gas".

4. A method of forming a tungsten silicide film according to claim 1, wherein said step of forming said first tungsten silicide layer comprises a process of forming a first tungsten silicide layer by using a first process gas having a phosphorus atom-containing gas added thereto, and said step of forming said second tungsten silicide layer comprises a process of forming a second tungsten silicide layer by using a second process gas having a phosphorus atom-containing gas added thereto, the phosphorus concentration in said second process gas being lower than that in said first process gas.

5. A method of forming a tungsten silicide film according to claim 4, wherein the addition amount of said phosphorus atom-containing gas to the first process gas is 0.02 to 0.2% by volume in terms of a phosphine gas.

6. A method of forming a tungsten silicide film according to claim 1, wherein said first tungsten silicide layer is formed to contain $1\times10^{21}$ to $5\times10^{21}$ $cm^{-3}$ of phosphorus atoms, and said second tungsten silicide layer is formed to contain $5\times10^{19}$ to $1\times10^{21}$ $cm^{-3}$ of phosphorus atoms.

7. A method of forming a tungsten silicide film according to claim 1, wherein the phosphorus concentration in said second tungsten silicide layer is $1/10$ or less of the phosphorus concentration in said first tungsten silicide layer.

8. A method of forming a tungsten silicide film according to claim 1, further comprising a heating step, which is performed after formation of the first and second tungsten silicide layers, for heating the first and second tungsten silicide layers at temperatures higher than those in the step of forming these tungsten silicide layers for controlling the phosphorus concentration in these tungsten silicide layers at $5\times10^{19}$ to $1\times10^{21}$ $cm^{-3}$.

9. A method of forming a tungsten silicon film according to claim 1, wherein the tungsten silicide film has 0.06 to 0.1 $\mu$m of an average value of the crystal grain diameters and a standard deviation of 0.01 $\mu$m or less.

10. A method of forming a tungsten silicon film according to claim 1, wherein the first tungsten silicide layer is doped with phosphorus and having less than $2/5$ of a ratio of the number of silicon atoms to the number of tungsten atoms; and the second tungsten silicide layer is doped with phosphorus in a concentration lower than or equal to the phosphorus concentration in the first tungsten layer and having a ratio of the number of silicon atoms to the number of tungsten atoms exceeding $2/5$.

11. A method of forming a tungsten silicide film according to claim 1, wherein the first tungsten silicide layer is relatively rich in silicon, and the second silicide layer is relatively rich in tungsten.

12. A method of forming a tungsten silicide film, comprising:

a first step of forming a first tungsten silicide layer relatively rich in silicon and doped with phosphorus on a polycrystalline silicon film;

a second step of forming a second tungsten silicide layer relatively rich in tungsten on said first tungsten silicide layer; and a third step of heating these first and second tungsten silicide layers to permit the phosphorus atoms doped in the first tungsten silicide layer to be partly diffused into the second tungsten silicide layer; wherein the phosphorus concentration in the second tungsten silicide layer is lower than the phosphorus concentration in said first tungsten silicide layer.

13. A method of forming a tungsten silicon film according to claim 12, wherein the tungsten silicide film has crystals of cubic system and having at least 10 of a ratio of the crystals oriented substantially on the (002) face to the crystals oriented on the (101) face.

* * * * *